Aug. 1, 1961 W. SHOCKLEY 2,994,121

METHOD OF MAKING A SEMICONDUCTIVE SWITCHING ARRAY

Filed Nov. 21, 1958 2 Sheets-Sheet 1

WILLIAM SHOCKLEY
INVENTOR.

BY Flehr and Swain

ATTORNEYS

FIG. 6.
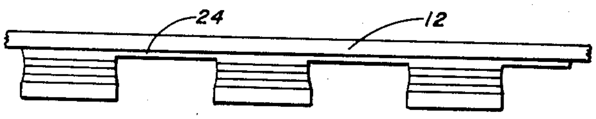
FIG. 7.
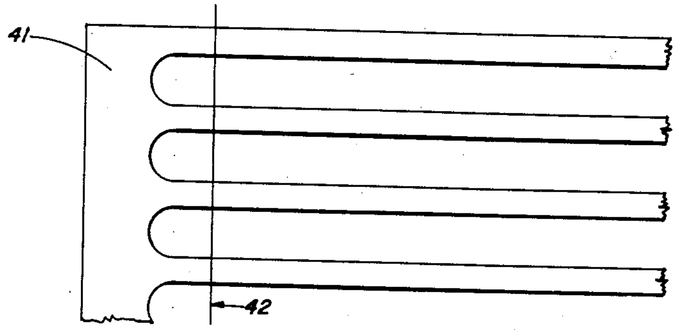
FIG. 8.
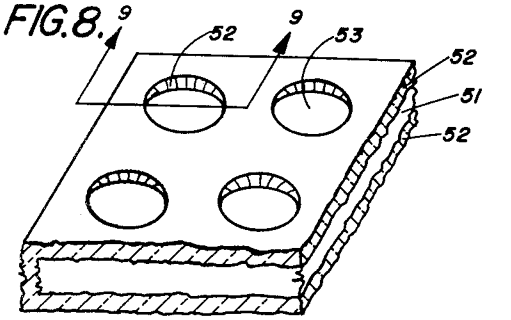
FIG. 12.
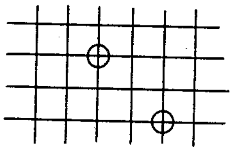
FIG. 13.
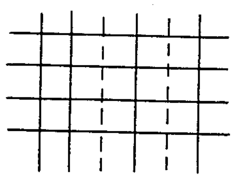
FIG. 9, FIG. 10.
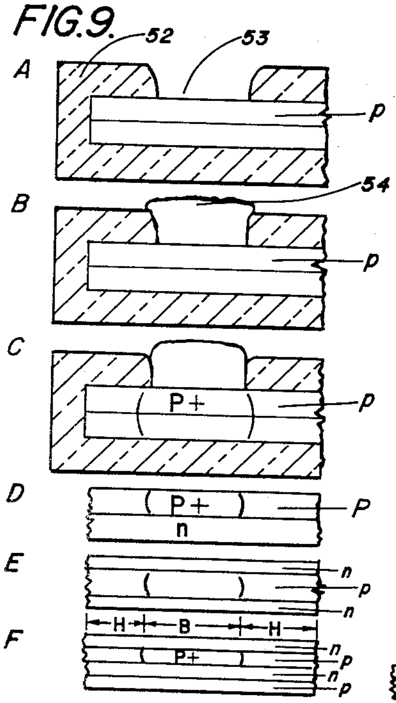
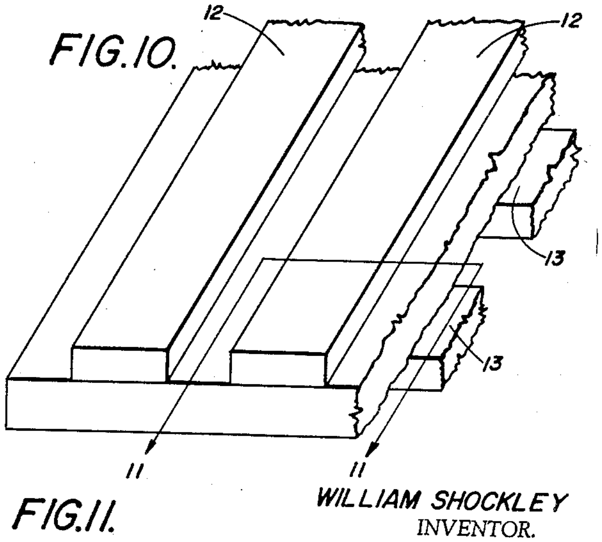
FIG. 11.
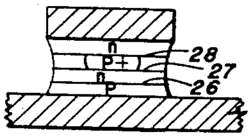
WILLIAM SHOCKLEY
INVENTOR.
BY Fleher and Swain
ATTORNEYS United States Patent Office 2,994,121
Patented Aug. 1, 1961

2,994,121

METHOD OF MAKING A SEMICONDUCTIVE SWITCHING ARRAY

William Shockley, 23466 Corta Via, Los Altos, Calif.

Filed Nov. 21, 1958, Ser. No. 775,504
6 Claims. (Cl. 29—25.3)

This invention relates to a switching array including semiconductive switching devices and to a method of making the same.

In many applications, it is desirable to connect selected ones of one group of signal channels with selected ones of another group of signal channels. It is desirable to be able to do this in response to control voltages. In the prior art, this has been achieved with complex circuits employing relays, and in recent years with complex circuits employing other types of switching devices, for example, semiconductive switching devices.

It is a general object of the present invention to provide an improved switching array and method of making the same.

It is another object of the present invention to provide a method for making a switching array including a plurality of four-layer semiconductive switching devices.

It is a further object of the present invention to provide a semiconductive switching array and method of making the same which includes a plurality of spaced parallel first conductors spaced from a plurality of spaced parallel second conductors with each of the conductors of each group making ohmic contacts with one terminal of a plurality of four-layer switching devices, and the other terminal of each of said plurality of devices making contact with individual ones of the conductors of the other spaced group of parallel conductors.

These and other objects of the invention will become more clearly apparent from the following description when taken in conjunction with the accompanying drawing.

Referring to the drawing:

FIGURE 6 shows a side elevational view of a portion of another array in accordance with the present invention;

FIGURE 7 shows a suitable parallel conductor assembly for forming devices in accordance with the present invention;

FIGURE 8 is a perspective view of a portion of a wafer suitable for making an array in accordance with the present invention which includes improved switching devices;

FIGURES 9A–F show the steps of forming improved switching devices in the wafer for use in forming an array of the type described;

FIGURES 10 shows the wafer of FIGURES 8 and 9 with parallel conductors making ohmic contacts therewith;

FIGURE 11 is an enlarged view of the portion 11—11 of FIGURE 10 after an etching operation;

FIGURE 12 shows a four by six matrix including two pad devices; and

FIGURE 13 shows a four by four matrix made from the matrix of FIGURE 12.

Figures 1, 2:
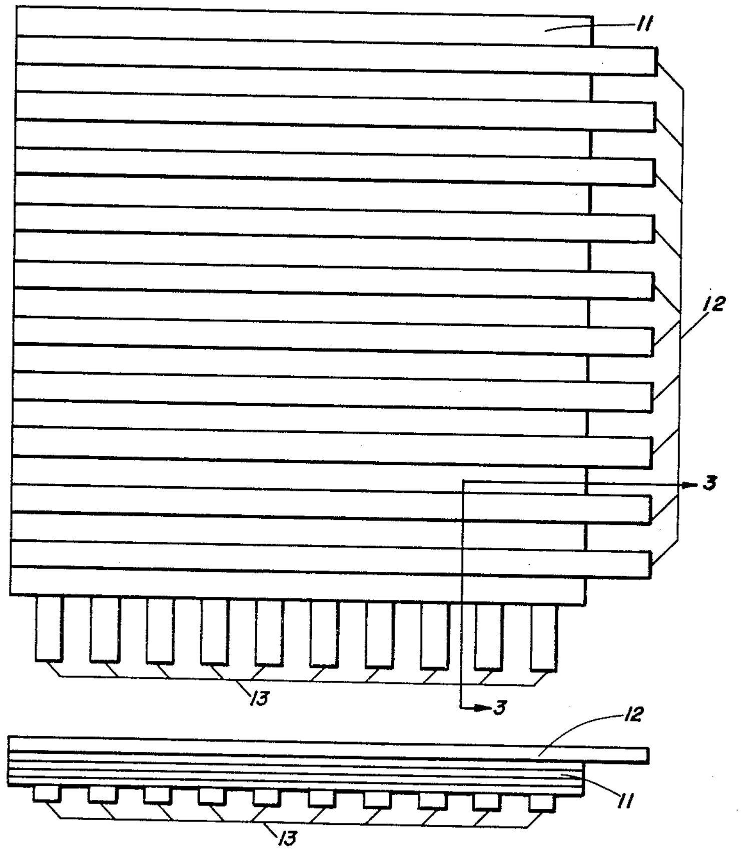
FIGURE 1 is a plan view showing a compositional semiconductive structure with conductors attached which illustrates one of the steps in making a semiconductive array in accordance with the present invention.
FIGURE 2 is a side elevational view of FIGURE 1.

Referring to FIGURES 1 and 2, a semiconductive wafer 11 having a desired compositional structure is shown with first and second groups 12 and 13 of spaced parallel conductors making suitable ohmic contact with opposite surfaces. The conductors 12 and 13 are shown at right angles with respect to one another; however, it will become apparent that groups of conductors making any other angle may be employed.

In any event, there is formed a cross grid of conductors which are in ohmic contact with the opposite surfaces of the compositional structure 11.

The compositional structure 11 is formed from a wafer of semiconductive material of one conductivity type, for example, p-type. The wafer is then subjected to several diffusion operations to form a wafer having four layers forming three junctions. In the prior art, wafers of this type have been diced and contacts made to the ends of each die to form four-layer two-terminal switching devices. Switching devices of this type have two states, a high resistance state and a low resistance state. The device is switched from the high resistance state to the low resistance state by application of a voltage of predetermined value. The voltage required to sustain the low resistance state is small in comparison to the switching voltage. As long as a current which exceeds the holding current flows through the device, it maintains its low resistance state. When the current flowing through the device drops below the holding value, the device reverts to its high resistance state. The thickness and carrier concentration can be controlled to yield devices having desired characteristics.

Figure 3:
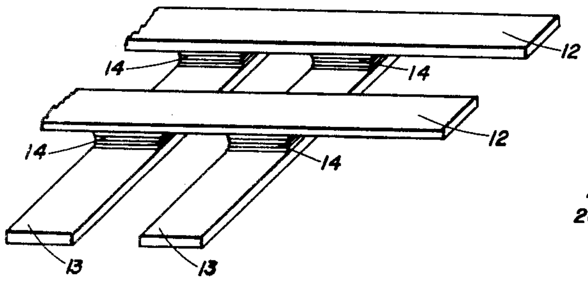
FIGURE 3 is an enlarged perspective view of the portion 3—3 of FIGURE 1 after the assembly has been etched.

After the wafer having the desired compositional structure is formed, the groups of conductors 12 and 13 are placed in registry with the wafer. Ohmic contact is then formed along the entire length of the conductors with the surfaces of the wafer. The wafer with the conductors is placed in an etching solution which serves to etch away the semiconductive material between the parallel conductors. The conductors are selected whereby they are relatively immune to the etching solutions, for example, molybdenum or tungsten with a protective gold plate. A hydrofluoric-nitric acid etching solution may be employed. Since the conductors 12 and 13 are not attacked by the etching solution, the semiconductive material lying below the conductors 12 and 13 remains. If the wafer is left in the etching solution for a sufficient length of time, all the semiconductive material between conductors is removed and the resulting structure is of the type shown in FIGURE 3. Each of the conductors 12 makes ohmic contact with one terminal of a plurality of semiconductive devices 14 with the other terminal of each of the devices 14 making contact with individual ones of the spaced group of conductors 13. Likewise, each of the conductors 13 makes ohmic contact with the other terminal of a plurality of semiconductive devices 14 with the one terminal of the devices 14 making contact with individual ones of the spaced group of conductors 12.

Thus, if 10 conductors are employed in each of the groups as illustrated in FIGURE 1, an array is formed which includes 100 switching devices. Any one of the 10 input lines 12 may be connected with any one of the output lines 13 in response to a switching voltage. The devices are switched by applying a voltage between the desired one of the lines 13 and the conductors 12 whereby the voltage momentarily exceeds the switching value. A voltage pulse may be employed to effect switching. As long as the current exceeds the sustaining value of current, the conductors remain interconnected.

Since the switching array is rather fragile, it is preferably mounted in a housing or box. For example, the housing may comprise a ceramic box 31 having a recess 32 adapted to receive the switching array. The switching array rests on the bottom surface 33 and the lines 12 and 13 are connected to the lines 36 and 37 respectively which extend outwardly through the wall of the receptacle. The entire assembly may then be potted or placed in a hermetically sealed container with the leads 36 and 37 available for making connection to the conductors 12 and 13.

Figure 4:
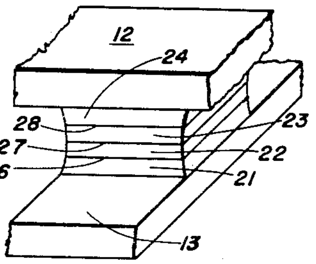
FIGURE 4 is an enlarged perspective view of one of the switching devices included in the array.
Figure 5:
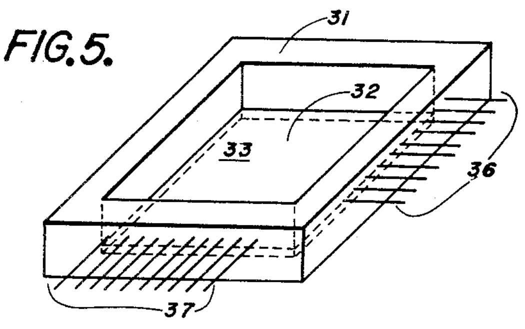
FIGURE 5 shows a mounting means suitable for mounting an array of switching devices in accordance with the invention.

Referring to FIGURE 4, an enlarged view of one of the switching devices 14 is shown. It is seen that the device includes the contiguous layers 21, 22, 23 and 24 forming the junctions 26, 27 and 28. The upper layer 24 forms an ohmic contact with the conductor 12, while the lower layer 21 forms an ohmic contact with the conductor 13.

Referring to FIGURE 6, a side elevational view of another array is shown. The wafer is subjected to the etching solution for a period of time such that the material is not completely removed having a portion of the upper layer 24 and the lower layer 21 (not shown). The essential requirement is that the device be left in the etching solution for a period of time which is sufficient to etch away enough material to expose all of the junctions 26, 27 and 28.

It may be time consuming or require special jigs to position a plurality of conductors 12 or 13. The procedure may be simplified if the plurality of conductors is stamped from a single sheet of material 41. After the conductors have been mounted on opposite surfaces of the wafer, the end portions are removed along the line 42 whereby a plurality of parallel spaced contacts remain which form ohmic contact with the semiconductive wafer. It may be preferable to wait until the wafer has been etched and mounted on a suitable base prior to shearing.

In copending application Serial No. 722,577, filed March 19, 1958, there is described a method of forming a semi-conductive switching device which includes a pair of contiguous regions, one of which serves to control the breakdown characteristics of the device and which has no exposed junctions and the other of which serves to determine the holding characteristics of the device and in which junctions are exposed. A device of this type is relatively immune to external conditions.

An array of devices of the type described in said copending application may be easily formed in accordance with the present invention. To form the array, the wafer 51 is subjected to oxygen at a relatively high temperature whereby an oxide coating 52 is formed on all of its surfaces. By suitably masking the oxide coating, as for example, by using a wax mask or by using a photoresist certain regions of the oxide coating are protected while others are exposed. The wafer is then subjected to an etchant which serves to remove the exposed oxide coating and to form a plurality of openings 53 which expose the upper surface of the underlying semiconductive wafer 51.

FIGURE 9A shows a sectional view through one of said exposed areas. The wafer then has predeposited thereon phosphor whereby the phosphor fills the openings 53 as indicated at 54, FIGURE 9B. The wafer is then subjected to a diffusion operation whereby the phosphor diffuses into the p-type wafer to form a p+ insert within the p-type layer. The oxide is then removed from the wafer and the upper surface is suitably protected and an n-type region is formed by diffusion in the lower surface, FIGURE 9D. A second diffusion with masking forms an n-type layer in the upper surface, FIGURE 9E. Masking of the upper surface and a subsequent diffusion in the presence of acceptors will form a p-type layer on the lower surface, FIGURE 9F, giving a four-layer device in which the outer region is the holding region and the interior region is the breakdown region, a region wherein carrier multiplication through avalanche breakdown occurs initially. This region is not exposed to the surface whereby the avalanche characteristics are not effected by external conditions.

After a compositional wafer of the type described with a plurality of the breakdown and holding regions is formed, the contacts 12 and 13 are applied, FIGURE 10, as previously described to make ohmic contact with the upper and lower surfaces of the wafer. The contacts are of such extent that when the wafer is subjected to an etching operation, both holding regions and breakdown regions will remain in each of the devices of the array, FIGURE 11. Thus, an array having a plurality of four-layer semiconductive devices is formed. The array formed has the advantage that the breakdown characteristics of the device are unaffected by external conditions.

It is desirable to provide more devices than is required whereby if defective devices occur in the process of fabricating the array, an array having the required number of devices can still be made. Assuming that a four by four array is required, the original array may be a four by six array as shown in FIGURE 12. If two defective devices occur as indicated by the circles, the four horizontal conductors are used and four of the vertical conductors are used giving a four by four array as shown in FIGURE 13. It is evident that a variety of choices is available for elimination of a small percentage of bad devices.

Thus, it is seen that there is provided a switching array and method of making the same which includes a large number of devices in a relatively small package. The switching devices are formed into the array in a simple and efficient manner.

I claim:

1. The method of making a semiconductive switchin array which comprises the steps of forming a slice o semiconductive material having the desired compositiona structure, forming a plurality of elongated parallel ohmi contacts on one surface thereof, forming a plurality o elongated parallel ohmic contacts on the other surfac thereof, said first and second contacts forming an angl with respect to one another, and removing the semicor ductive material which lies between the ohmic contac whereby switching devices are formed at each crossin of the first and second contacts.

2. The method of making a semiconductive switchir array which comprises the steps of forming a slice c semiconductive material having the desired composition structure, forming a plurality of elongated spaced parall ohmic contacts on one surface thereof, forming a plurali of elongated spaced parallel ohmic contacts on the oth surface thereof, said first and second contacts formi an angle with respect to one another whereby a plurali of cross points are formed, and selectively removing tl semiconductive material which lies between contac whereby a switching device is formed at each crossing the first and second contacts.

3. The method of making a semiconductive switchi array which comprises forming a wafer of semiconducti material having an array of regions in which carrier mul plication through avalanche breakdown occurs initial forming a plurality of elongated spaced parallel ohn contacts on one surface of said wafer, forming a p rality of spaced parallel ohmic contacts on the other s face of said wafer, said first and second contacts formi an angle with one another to form a plurality of cro ings with the crossings occurring at said regions, a selectively removing semiconductive material which l between contacts whereby a switching device is forn at each crossing of the first and second contacts, e of said devices including said avalanche region anc surrounding region.

4. The method of making a semiconductive ar which comprises the steps of forming a slice of se conductive material having at least two layers of op site conductivity type forming a rectifying juncti applying a plurality of elongated spaced parallel c ductors in ohmic contact on one surface thereof, apply a plurality of elongated spaced parallel conductors ohmic contact on the other surface thereof, said and second conductors forming an angle with respect to one another whereby a plurality of cross points are formed, and selectively removing the semiconductive material which lies between the conductors so that the rectifying junction is exposed to form a semiconductive device at each crossing of the first and second conductors.

5. A method as in claim 4 wherein the slice of semiconductive material includes three layers forming two rectifying junctions, and wherein the selective removal of semiconductive material serves to expose both of the rectifying junctions.

6. A method as in claim 4 wherein said slice of semiconductive material includes four layers forming three rectifying junctions, and wherein said selective removal of semiconductive material serves to expose all three rectifying junctions.

References Cited in the file of this patent

UNITED STATES PATENTS

| | | |
|---|---|---|
| 2,751,528 | Burton | June 19, 1956 |
| 2,780,759 | Boyer et al. | Feb. 5, 1957 |
| 2,813,326 | Liebowitz | Nov. 19, 1957 |
| 2,836,878 | Shepard | June 3, 1958 |